US009037942B2

(12) United States Patent
Zopf

(10) Patent No.: US 9,037,942 B2
(45) Date of Patent: May 19, 2015

(54) MODIFIED JOINT SOURCE CHANNEL DECODER

(71) Applicant: Broadcom Corporation, Irvine, CA (US)

(72) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 80 days.

(21) Appl. No.: 13/749,187

(22) Filed: Jan. 24, 2013

(65) Prior Publication Data

US 2013/0191707 A1 Jul. 25, 2013

Related U.S. Application Data

(60) Provisional application No. 61/753,809, filed on Jan. 17, 2013, provisional application No. 61/706,328, filed on Sep. 27, 2012, provisional application No. 61/590,015, filed on Jan. 24, 2012.

(51) Int. Cl.
*H03M 13/00* (2006.01)
*H03M 13/05* (2006.01)
*H03M 13/29* (2006.01)

(52) U.S. Cl.
CPC .......... *H03M 13/05* (2013.01); *H03M 13/2957* (2013.01); *H03M 13/6312* (2013.01); *H03M 13/6525* (2013.01)

(58) Field of Classification Search
CPC ............ H03M 13/2957; H03M 13/29; H03M 13/1515; H03M 13/2909; G11B 20/1833
USPC .................................................. 714/755
See application file for complete search history.

(56) References Cited

U.S. PATENT DOCUMENTS

| 5,838,267 | A | 11/1998 | Wang et al. |
| 6,557,139 | B2 | 4/2003 | Böhnke |
| 6,625,775 | B1 * | 9/2003 | Kim .............................. 714/755 |
| 6,731,700 | B1 | 5/2004 | Yakhnich et al. |
| 6,826,235 | B2 | 11/2004 | Lerner et al. |
| 8,214,727 | B2 | 7/2012 | Kang et al. |
| 8,225,167 | B2 | 7/2012 | Choi et al. |
| 8,660,167 | B2 | 2/2014 | Wehinger |
| 2002/0166092 | A1 | 11/2002 | Kyosti et al. |
| 2004/0240590 | A1 * | 12/2004 | Cameron et al. .............. 375/340 |
| 2006/0203943 | A1 | 9/2006 | Scheim et al. |
| 2009/0285320 | A1 * | 11/2009 | Cameron et al. .............. 375/265 |
| 2010/0115373 | A1 * | 5/2010 | Calvanese Strinati et al. ................. 714/755 |
| 2010/0281089 | A1 | 11/2010 | Vigoda et al. |
| 2011/0087944 | A1 | 4/2011 | Li et al. |
| 2013/0188758 | A1 | 7/2013 | Zopf |
| 2013/0191120 | A1 | 7/2013 | Zopf et al. |
| 2013/0191706 | A1 | 7/2013 | Zopf |

* cited by examiner

*Primary Examiner* — Albert Decady
*Assistant Examiner* — Enam Ahmed
(74) *Attorney, Agent, or Firm* — Fiala & Weaver P.L.L.C.

(57) ABSTRACT

A turbo decoder is configured to perform iterative decoding of data bits of a data packet received via a source signal to converge on a "soft" decision representation for each data bit of the data packet. The turbo decoder includes both an interleaved decoder and a non-interleaved decoder that work collaboratively to refine and improve the "soft" decision of each of the originally-received data bits. The interleaved decoder and the non-interleaved decoder are injected with extrinsic information based on at least a-priori information of the source signal. The turbo decoder avoids positive feedback of the a-priori information regarding the source signal from one decoder to the other by subtracting out extrinsic information based on the a-priori information that is injected into a decoder from the "soft" decision(s) determined by the decoder.

20 Claims, 7 Drawing Sheets

300

MODIFIED JOINT SOURCE CHANNEL DECODER

CROSS-REFERENCE TO RELATED APPLICATIONS

This application claims priority to the following provisional applications, each of which is incorporated by reference in its entirety herein: U.S. Provisional Patent Application No. 61/590,015, filed Jan. 24, 2012, U.S. Provisional Patent Application No. 61/706,328, filed Sep. 27, 2012, and U.S. Provisional Patent Application No. 61/753,809, filed Jan. 17, 2013.

This application is also related to the following U.S. patent applications, each of which also claims the benefit of U.S. Provisional Patent Application Nos. 61/590,015 and 61/706,328, and each of which is incorporated by reference herein:

U.S. patent application Ser. No. 13/748,904, filed on even date herewith and entitled "Joint Source Channel Decoding Using Parameter Domain Correlation";

U.S. patent application Ser. No. 13/749,064, filed on even date herewith and entitled "Modem Architecture for Joint Source Channel Decoding"; and U.S. patent application Ser. No. 13/748,949, filed on even date herewith and entitled "Constrained Soft Decision Packet Loss Concealment."

BACKGROUND

1. Technical Field

The subject matter described herein relates to communication systems, and in particular, to joint source channel decoding.

2. Background

Communication systems, over which data is exchanged using communication channels, may encode the data at a transmitting end and decode the data at a receiving end. Implementations of encoder/decoder pairs can be used in a wide range of communication systems and devices, such as mobile devices, desktop computers, servers, computer networks, telecommunication networks, and the like.

The encoding and decoding of the transmitted data may allow for increased security of the data, compression of the data, etc. Data may be encoded using a wide variety of encoders/encoding algorithms and may likewise be decoded using a wide variety of decoders/decoding algorithms.

When decoding data that was received over a communication channel, a decoder may attempt to model the received data in order to determine whether error(s) exist in the received data. Different decoders may model data in different ways based upon how the data was encoded. Conventional techniques for modeling such data typically model an expected value for each data bit in a received data packet based on previous received values of other corresponding data bits and/or based on other data bits within the received data packet. Such techniques, however, traditionally do not take advantage of redundancy and/or correlations found in the structure of the received data.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 3:
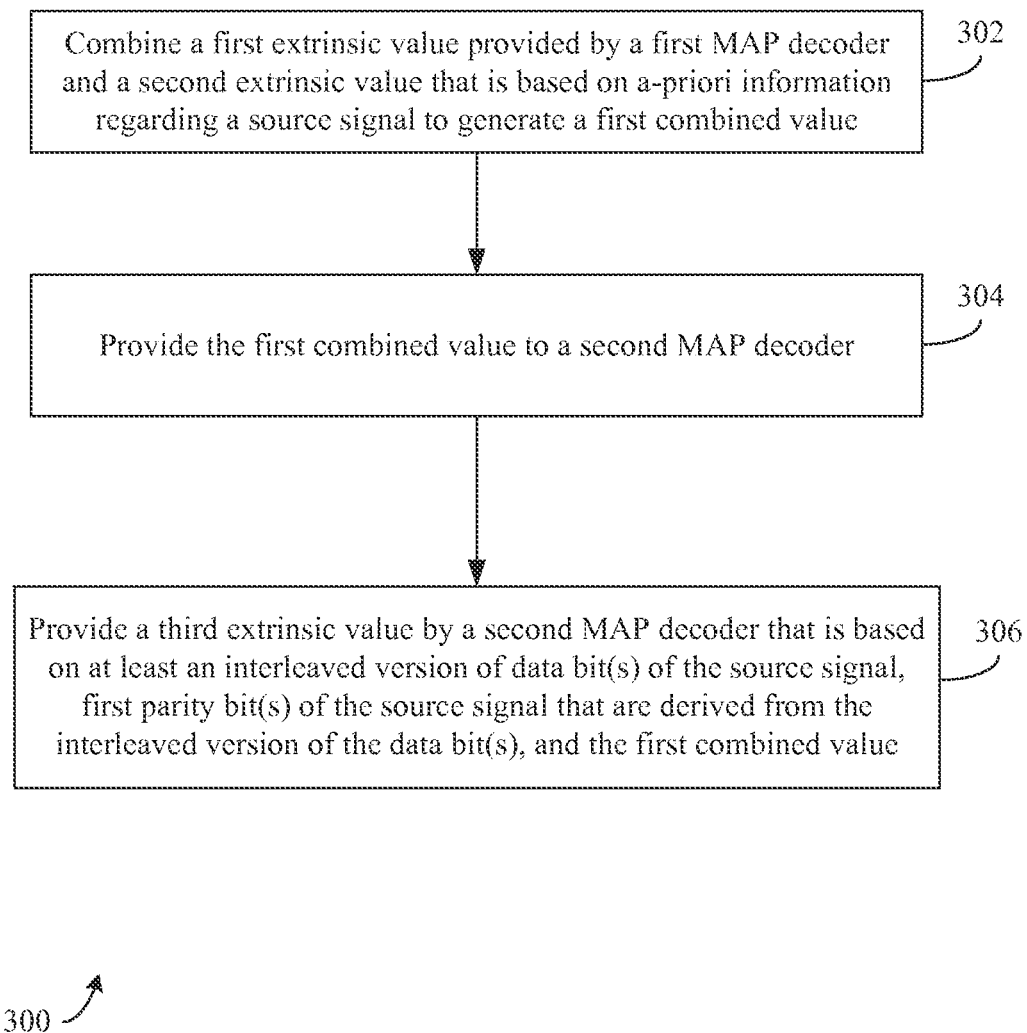
Figure 4:
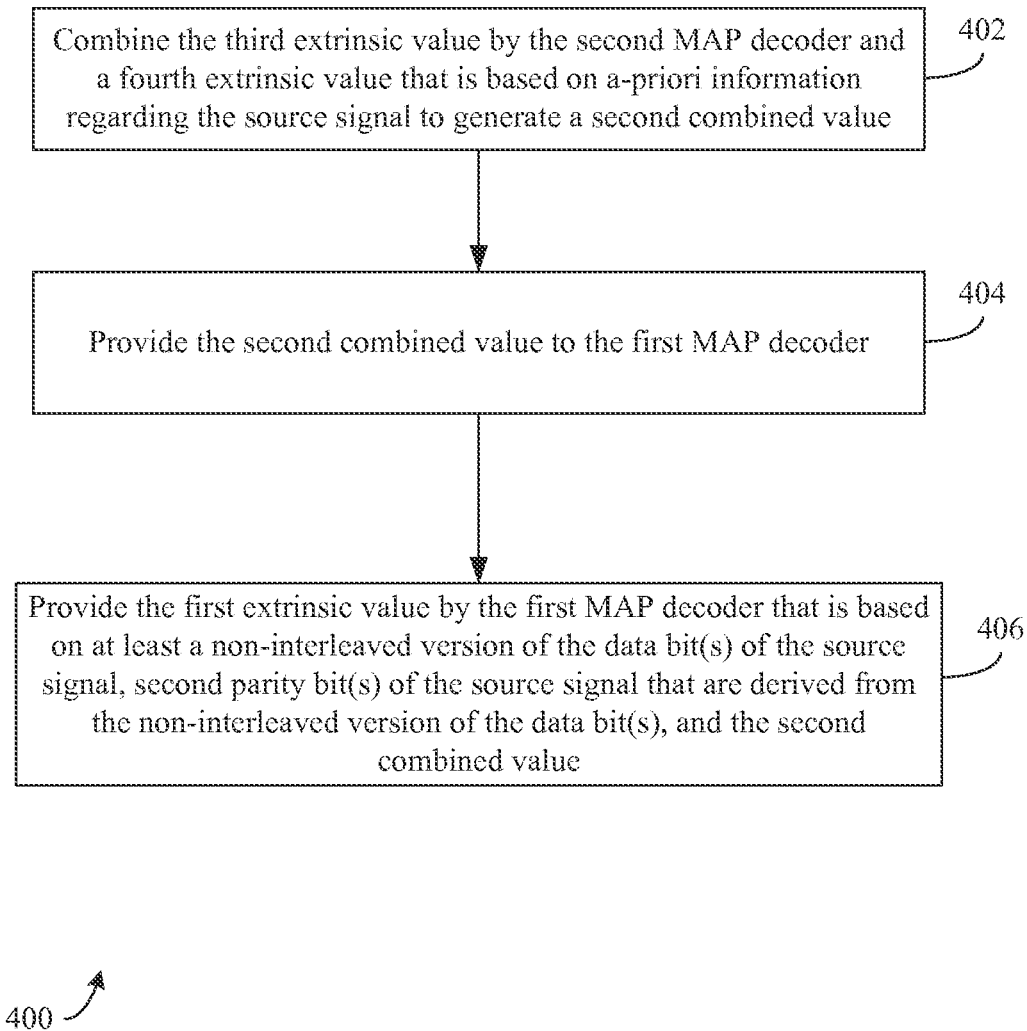
Figure 5:
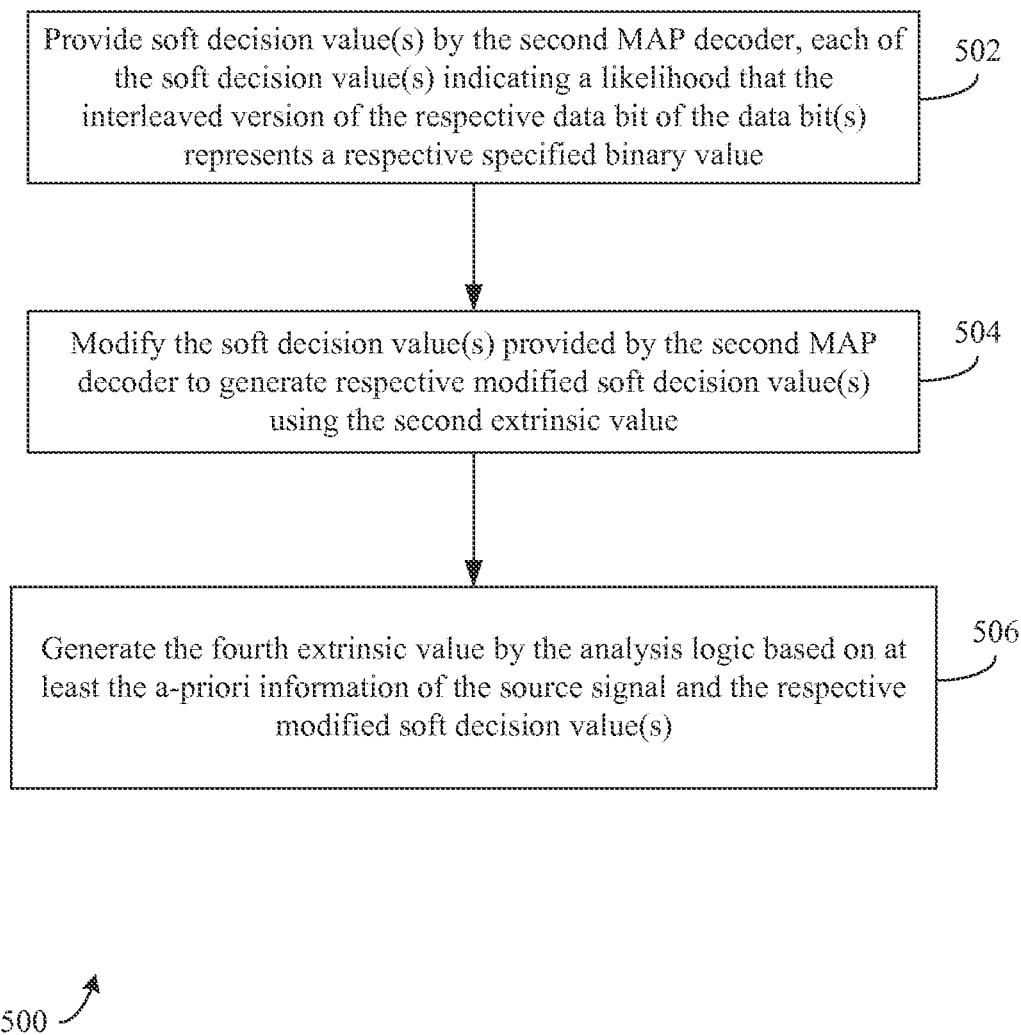

FIG. 3 depicts a flowchart of a method for providing extrinsic information for data bits received in a data packet via a source signal by an interleaved MAP decoder in accordance with an example embodiment described herein FIG. 4 depicts a flowchart of a method for providing extrinsic information for data bits received in a data packet via a source signal by a non-interleaved MAP decoder in accordance with an example embodiment described herein FIG. 5 depicts a flowchart of a method for providing extrinsic information by analysis logic based on "soft" decision values provided by an interleaved MAP decoder in accordance with an example embodiment described herein.

Figure 6:
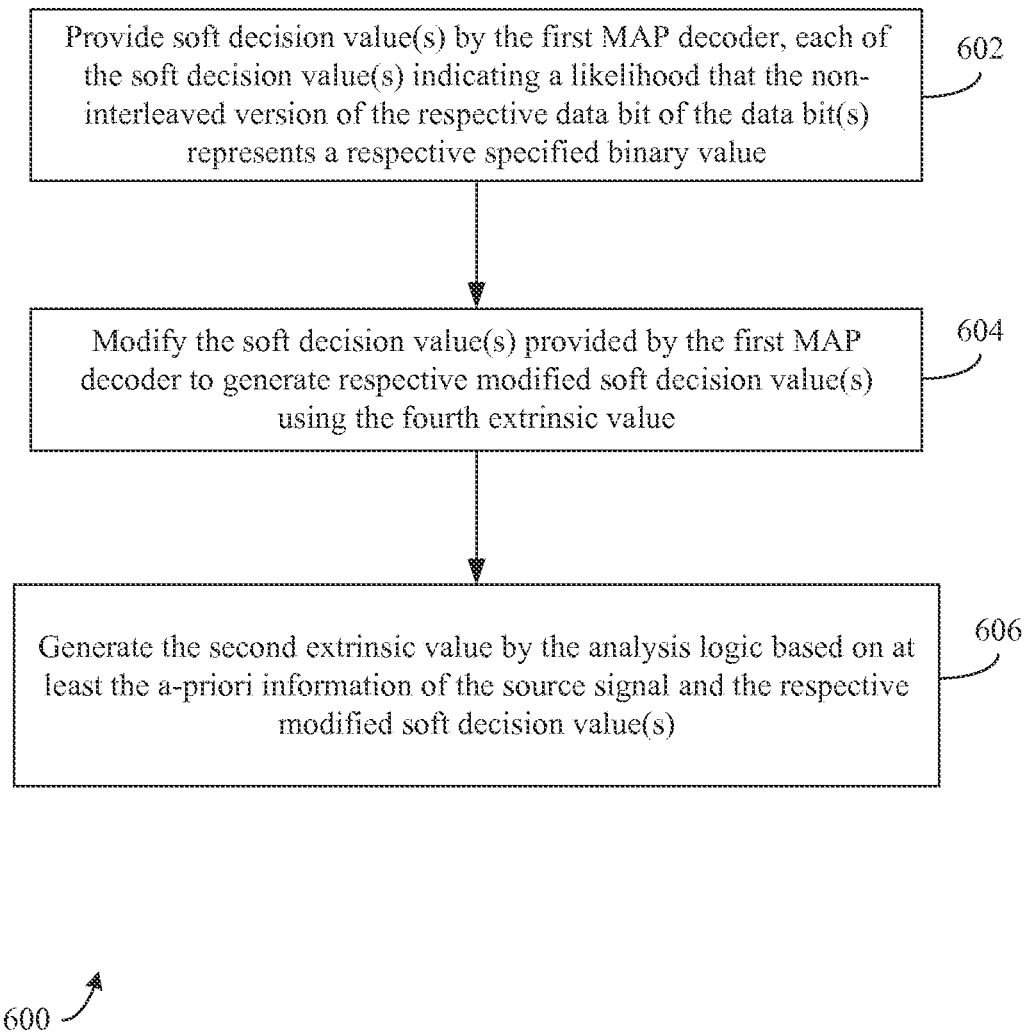

FIG. 6 depicts a flowchart of a method for providing extrinsic information by the analysis logic based on "soft" decision values provided by a non-interleaved MAP decoder in accordance with an example embodiment described herein.

Figure 7:
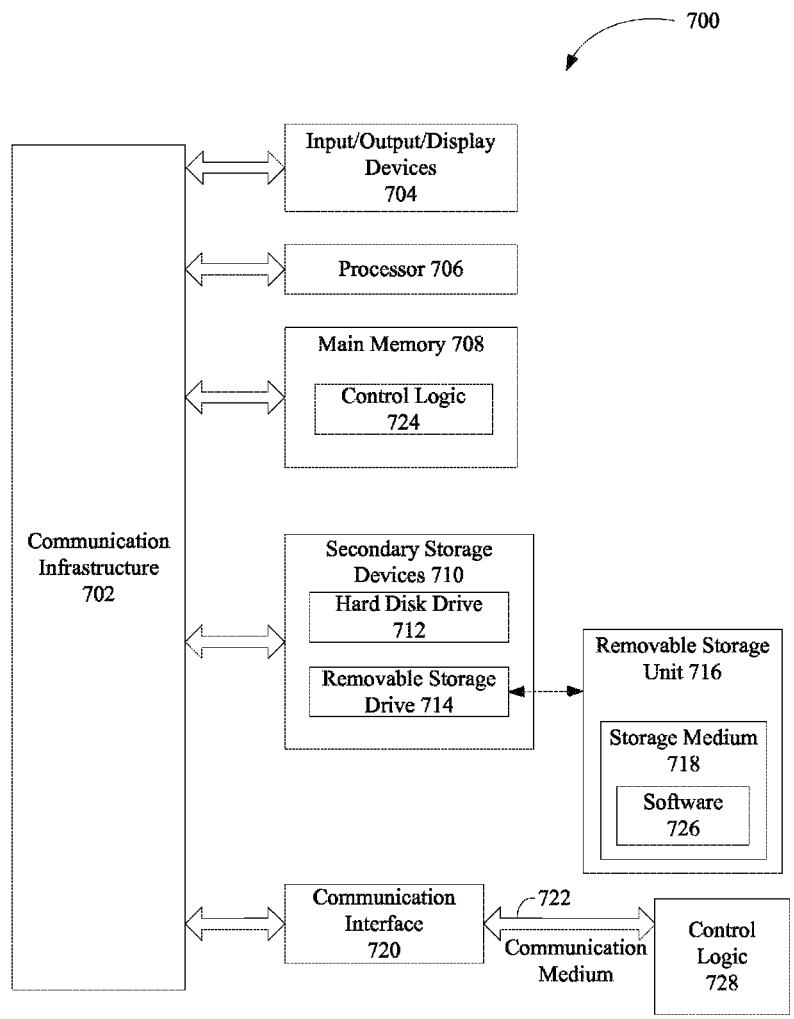

FIG. 7 is a block diagram of an example computer system in which embodiments may be implemented.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, terminology used herein to refer to decoder decisions and other information as "hard" refers to whether the decision or information represents actual, perceived data bits (e.g., a '1' (logical high signal value) or a '0' (logical low signal value)). The "hard" values are the actual data bits and/or what a decoder has determined the actual data bits to be. Terminology used herein to refer to decoder decisions and other information as "soft" refers to whether the decision or information are representations of the probability and/or the likelihood of a given data bit in a received data packet being a '1' or a '0'. "Soft bits," for example, may be represented as a decimal number between 0 and 1 (e.g., 0.2138 or 0.9853) for a probability, where a value less than 0.5 indicates a likelihood of the actual data bit (i.e., "hard bit") being a '0', while a value greater than 0.5 indicates a likelihood of the actual data bit (i.e., "hard bit") being a '1'. Similarly, a "soft bit" value may a real number in a range from −∞ (negative infinity) to +∞ (positive infinity) for a log likelihood ratio, as described herein.

Still further, references in the specification to "extrinsic data," "extrinsic information," or "extrinsic value(s)" refer to an information derived from processing data bits, parity bits, and/or other extrinsic information derived from a-priori information regarding a source signal containing data packet(s) that include data bits and/or parity bits. "Extrinsic information" may be represented as any real number value in a range from −∞ to +∞. "Extrinsic information" is used by decoders to facilitate decoding, as described herein.

Still further, terminology used herein such as "about," "approximately," and "substantially" have equivalent meanings and may be used interchangeably.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner

II. Example Embodiments

The examples described herein may be adapted to various types of wired and wireless communications systems, computing systems, communication devices, and/or the like, which include encoders and/or decoders. Furthermore, additional structural and operational embodiments, including modifications/alterations, will become apparent to persons skilled in the relevant art(s) from the teachings herein.

In embodiments, communication systems may be based on the Long Term Evolution (LTE) IP-based standard for wireless data communications. LTE provides higher access rates, lower latencies, reduced data delivery costs, and simplification of network architecture. Such embodiments may also provide Voice over LTE (VoLTE) services that are implemented as Voice over Internet Protocol (VoIP), which is supported by the IP Multimedia Subsystem (IMS) with specific profiles for control and media planes of voice service defined by Global System for Mobile Communications Association (GSMA) in Permanent Reference Document (PRD) IR.92 titled "IMS Profile for Voice and SMS" (v4.0, Mar. 22, 2011) (hereinafter "IR.92").

Communication system bandwidth used by data applications may in many cases be greater than the bandwidth for voice calls, but voice applications remain an important part of communication system utilization. It follows then that voice quality will remain a very important metric to consumers and companies which provide services and products. The embodiments described herein (e.g., for VoLTE) provide improved voice quality, decreased packet loss rates, and reduced channel noise for communication systems without undue decreases in network capacity and/or increased power consumption.

LTE communication systems may encode and decode data that is transmitted on communication channels using turbo coding. Example embodiments described herein based on turbo coding in LTE take advantage of joint source channel decoding (JSCD) as well as redundancies and correlations present in VoLTE. For example, data may be encoded using joint source channel coding (JSCC) in which the source and channel are encoded together. This particular type of encoder may be paired with a JSCD turbo decoder for decoding purposes.

In JSCC, the source (e.g., speech related data) and the channel (e.g., packet related data) are jointly encoded, while in JSCD, the source and the channel are jointly decoded. Embodiments described herein may implement JSCD even if the source and channel are not jointly encoded. JSCD as described in the example embodiments may allow for an optimized channel capacity while providing joint decoding benefits such as improved communication efficiency and performance as well as adherence to VoLTE standards.

Example embodiments relate to a turbo decoder configured to perform iterative decoding of data bits of a data packet received via a source signal to converge on a "soft" decision representation (e.g., a real number value) for each of the data bits that represents a likelihood of the respective data bit to be a logical "1" or a logical "0". These likelihoods may be presented as a ratio of probabilities, as will be discussed in further detail below. In example embodiments, a turbo decoder may include two or more decoders which operate collaboratively in order to refine and improve the estimate (i.e., the "soft" decision) of each of the originally-received data bits over one or more iterations until the "soft" decisions converge on a stable set of values or until a preset maximum number of iterations is reached. Each decoder may be injected with extrinsic information (e.g., determined by the other decoder and/or based on a-priori information (e.g., source statistics regarding the source signal). Prior solutions perform JSCD with only a single decoder (e.g., a non-interleaved decoder) to avoid improper and/or premature convergence for "soft" decisions. In accordance with example embodiments described herein, the turbo decoder avoids positive feedback of a-priori information regarding the source signal from one decoder to the other by subtracting out extrinsic information based on the a-priori information that is injected into a decoder from the "soft" decision(s) determined by the decoder. As such, the turbo decoder performs JSCD on both decoders and doubles the improvement achievable versus using only a single decoder.

In one example aspect, a method is described for iteratively decoding a source signal in a system including a first MAP decoder, second MAP decoder, and analysis logic in which a first extrinsic value provided by the first MAP decoder and a second extrinsic value that is based on a-priori information regarding the source signal are combined to generate a first combined value. The second extrinsic value is provided by the analysis logic. The first combined value is provided to the second MAP decoder. A third extrinsic value is provided by the second MAP decoder that is based on at least an interleaved version of data bit(s) of the source signal, first parity bit(s) of the source signal that are derived from the interleaved version of the data bit(s), and the first combined value.

In another example aspect, a turbo decoder is described that includes a first MAP decoder, a second MAP decoder coupled to the first MAP decoder, analysis logic coupled to the first MAP decoder and the second MAP decoder, and first addition logic. The first addition logic is configured to combine a first extrinsic value provided by the first MAP decoder and a second extrinsic value that is based on a-priori information regarding a source signal received by the turbo decoder to generate a first combined value. The analysis logic is configured to provide the second extrinsic value. The second MAP decoder is configured to provide a third extrinsic value that is based on at least an interleaved version of data bit(s) of the source signal, first parity bit(s) of the source signal that are derived from the interleaved version of the data bit(s), and the first combined value.

In yet another example aspect, a computer readable storage medium having computer program instructions embodied in said computer readable storage medium for enabling a processor to iteratively decode a source signal in a system including a first Maximum A-posteriori Probability (MAP) decoder, second MAP decoder, and analysis logic is described. The computer program instructions include instructions executable to perform operations in which a first extrinsic value provided by the first MAP decoder and a second extrinsic value that is based on a-priori information regarding the source signal are combined to generate a first combined value. The second extrinsic is provided by the analysis logic. The first combined value is provided to the second MAP decoder. A third extrinsic value is provided by the second MAP decoder that is based on at least an interleaved version of data bit(s) of the source signal, first parity bit(s) of the source signal that are derived from the interleaved version of the data bit(s), and the first combined value.

Various example embodiments are described in the following subsections. In particular, an example LTE architecture embodiment is described, followed by an example embodiment for a JSCD. Finally, an example computer embodiment is described.

III. Example LTE Architecture Embodiment

Figure 1:
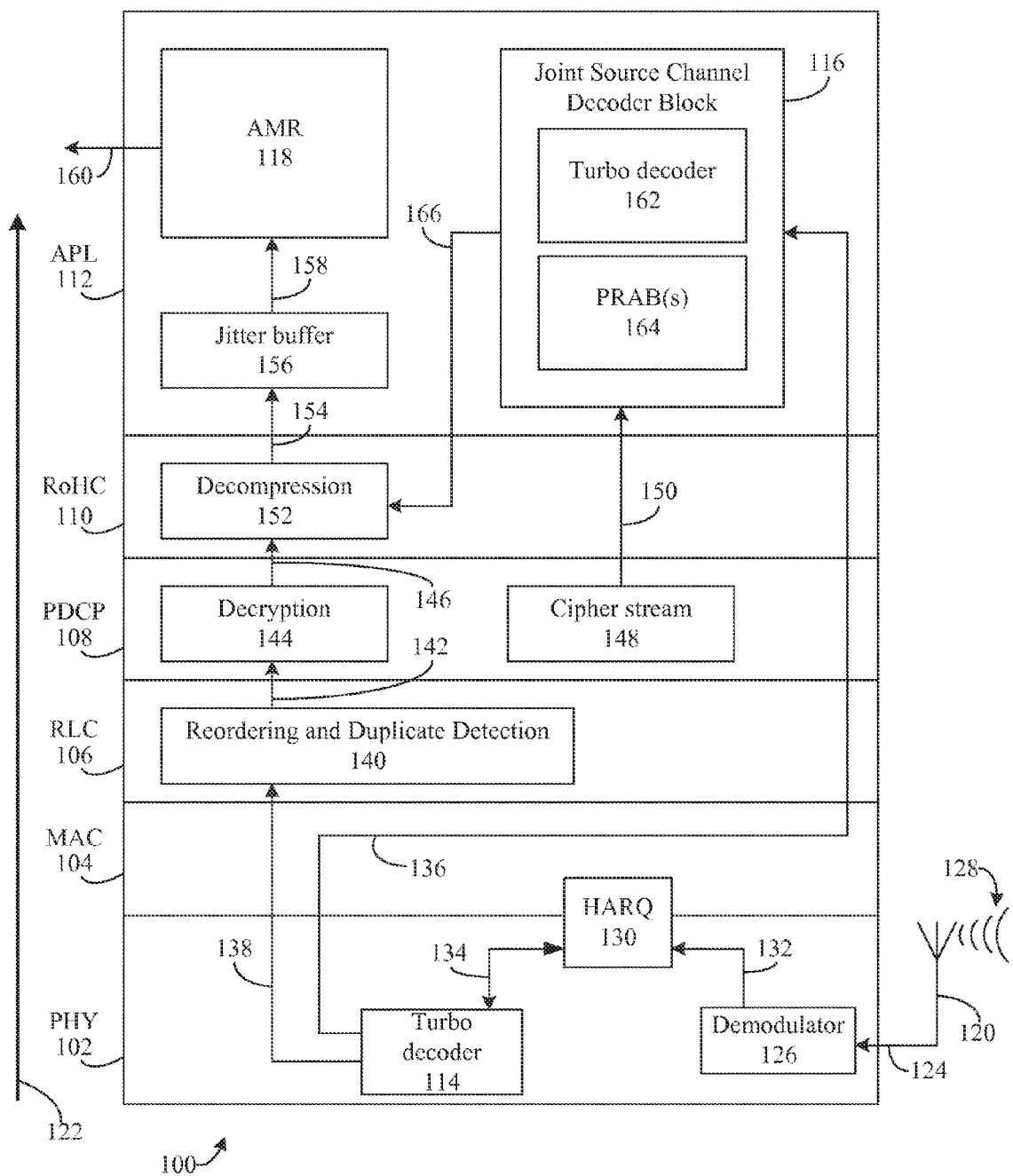
FIG. 1 is a block diagram of a Long-Term Evolution (LTE) modem architecture in accordance with an example embodiment described herein.

An LTE receiver, e.g., a modem, in a communication system may be configured in various ways to decode received data streams (e.g., one or more data packets) according to JSCD, in embodiments. For example, FIG. 1 shows a block diagram of an LTE modem architecture (hereinafter "LTE architecture") 100 in accordance with an embodiment described herein. LTE architecture 100 includes circuitry corresponding to the layers associated with the LTE protocol. The layers include a physical (PHY) layer 102, a medium access control (MAC) layer 104, a radio link control (RLC) layer 106, a packet data convergence protocol (PDCP) layer 108, a robust header compression (RoHC) layer 110, and an application (APL) layer 112. As shown, LTE architecture 100 also includes a first turbo decoder 114 in PHY layer 102, a JSCD block 116 in APL layer 112, an adaptive multi-rate speech decoder (hereinafter, "AMR") 118 in APL layer 112, and an antenna 120. LTE architecture 100 and each of the components included therein may include functionality and connectivity beyond what is shown in FIG. 1, as would be apparent to persons skilled in relevant art(s). However, such additional functionality is not shown in FIG. 1 for the sake of brevity.

As shown in FIG. 1, an arrow 122 indicates the general flow of the progression of data through the LTE protocol stack from PHY layer 102 to APL layer 112. It should be noted that the progression of data may deviate from the flow indicated by arrow 122 and that the LTE protocol may include fewer layers or additional layers (not shown).

The PHY layer 102 includes channel coding, error detection, modulation/demodulation, and/or other procedures to handle power control, multi-antenna operation, and/or the like. PHY layer 102 is based on orthogonal frequency division multiple access (OFDMA) for downlink and single carrier frequency division multiple access (SC-FDMA) in the uplink. As shown, PHY layer 102 includes a demodulator 126, a Hybrid Automatic Repeat Request (HARQ) block 130, and first turbo decoder 114. Antenna 120 receives incoming data signals on a data channel 128 and transmits each received data signal to demodulator 126 via a line 124. Demodulator 126 demodulates the received data signal and transmits the demodulated data (also referred to as "channel data") to HARQ block 130 via a line 132. HARQ block 130 stores the received channel data in a HARQ buffer located therein and forwards the received channel data to first turbo decoder 114 via line 134. First turbo decoder 114 decodes the channel data (which is encrypted data) to generate "soft bits." First turbo decoder 114 performs a cyclic-redundancy check (CRC) operation to determine whether any errors are present in the "soft bits." If the CRC operation fails (e.g., at least one error is present), first turbo decoder 114 directs HARQ block 130 to perform a retransmission request via line 134. The re-transmitted channel data, which is received in response to the retransmission request, is added to the channel data that is already in the HARQ buffer to provide composite channel data. The composite channel data from the HARQ buffer is forwarded to first turbo decoder 114 via line 134. First turbo decoder 114 re-executes using the composite channel data to generate new "soft bits" and performs another CRC operation on the newly-generated "soft bits." This process repeats until the CRC passes or the number of retransmission requests made by HARQ block 130 reaches a predetermined threshold. In either case, first turbo decoder 114 transmits the "soft bits" to the APL layer 112 via a line 136.

First turbo decoder 114 also decodes the channel data to generate "hard bits" (the decoded channel data bits received via the data stream, i.e., the logical "1" or logical "0" that first turbo decoder 114 has determined to be the actual data bits) and transmits the "hard bits" to MAC layer 104 via a line 138.

MAC layer 104 functions include the mapping and multiplexing of logical channels to transport channels. MAC layer 104 also handles the physical layer retransmissions (e.g., performed via HARQ block 130) that are applied to certain applications that have a low delay property (e.g., voice applications). Scheduling is also implemented in MAC layer 104 with priority handling to ensure a sufficient level of Quality of Service. As shown, HARQ block 130 overlaps with MAC layer 104 as well as with PHY layer 102. That is, MAC layer 104 may control, in full or in part, the actual physical retransmission that occurs in PHY layer 102.

RLC layer 106 handles retransmissions and segmentation. As shown, RLC layer 106 includes reordering and duplicate detection block 140 which corrects out of order packet sequences and duplicate packets (e.g., due to a retransmission request performed via HARQ block 130). Data is transmitted from RLC layer 106 to PDCP layer 108 via a line 142.

PDCP layer 108 handles ciphering and header compression. As shown, PDCP layer 108 includes a decryption block 144 and a cipher stream block 148. Decryption block 144 uses a cipher to decode encrypted data passed from the lower layers (e.g., encrypted "hard" bits from first turbo decoder 114) and transmit the decoded data to RoHC layer 110 via a line 146. Cipher stream block 148 provides the cipher to the APL layer 112, via a line 150, in order to allow applications and/or circuitry in the APL layer 112 to properly decrypt encrypted data (e.g., encrypted "soft" bits provided to the APL layer 112 via line 136).

RoHC layer 110 supports robust header compression as specified in the $3^{rd}$ Generation Partnership Project Technical Specification (3GPP TS) 36.323, Internet Engineering Task Force (IETF) Request for Comments (RFC) 3095, and IETF RFC 4815. As shown, RoHC layer 110 includes decompression block 152 which decompresses Internet Protocol (IP) packet headers for transmission to the APL layer 112 via a line 154.

APL layer 112 supports applications and services such as data buffering and speech decoding. As shown, APL layer 112 includes a jitter buffer 156, JSCD block 116, and AMR 118. Jitter buffer 156 buffers voice data for delivery of the voice data to AMR 118 to allow for smooth output of decoded speech by AMR 118. In some embodiments, AMR 118 may be a narrow-band multi-rate speech decoder (AMR-NB). AMR 118 outputs decoded speech via a line 160.

JSCD block 116 includes a second turbo decoder 162 and a Packet Redundancy Analysis Block (PRAB) 164. JSCD block 116 also includes modules, circuitry, and/or applications for data storage (not shown), for encrypting and/or decrypting hard data (not shown), for performing data transformations on "soft" bits to pass between encrypted and decrypted domains (not shown), and for routing received "soft" bits within the JSCD block 116 based upon an indication of whether errors are present in a data packet or not (not shown). JSCD block 116 receives encrypted "soft" bits via line 136, and second turbo decoder 162 performs its decoding operations based on the received encrypted "soft" bits and based on extrinsic data inputs received from one or more PRAB modules in PRAB 164, discussed in further detail below.

The resulting decoded data based on the "hard" decision of second turbo decoder 162 is decrypted in JSCD block 116 and transmitted to decompression block 152 (e.g., via line 166) where the decrypted, decoded data is re-inserted into the data stream. It should be noted, however, that in various embodiments, the "hard" decision data output by turbo decoder 162 may be provided to different elements and/or layers depicted in LTE architecture 100.

Second turbo decoder 162 provides for an additional turbo decoder that runs in APL layer 112 (in addition to turbo decoder 114 that runs in PHY layer 102). Running in APL layer 112 allows the additional turbo decoder to be configurable and flexible in application without modifying or affecting performance of first turbo decoder 114 in PHY layer 102. For example, first turbo decoder 114 is agnostic with respect to source signal information within a given packet, but second turbo decoder 162 may be configured in APL layer 112 to utilize packet information to improve decoding. LTE architecture 100 also provides for transparent layers through which "soft" bits generated by first turbo decoder 114 can be passed to APL layer 112 for use by JSCD block 116 and the elements therein. Likewise, cipher stream block 148 can provide a cipher stream for use by JSCD block 116 in APL layer 112.

LTE architecture 100 and each of the elements included therein may be implemented in hardware, or a combination of hardware and software and/or firmware.

Additional information regarding an example LTE modem architecture is described in commonly-owned, co-pending U.S. patent application Ser. No. 13/749,064, entitled "Modem Architecture for Joint Source Channel Decoding" and filed on even date herewith, the entirety of which is incorporated by reference herein.

IV. Example Joint Source Channel Decoder Embodiments

Figure 2:
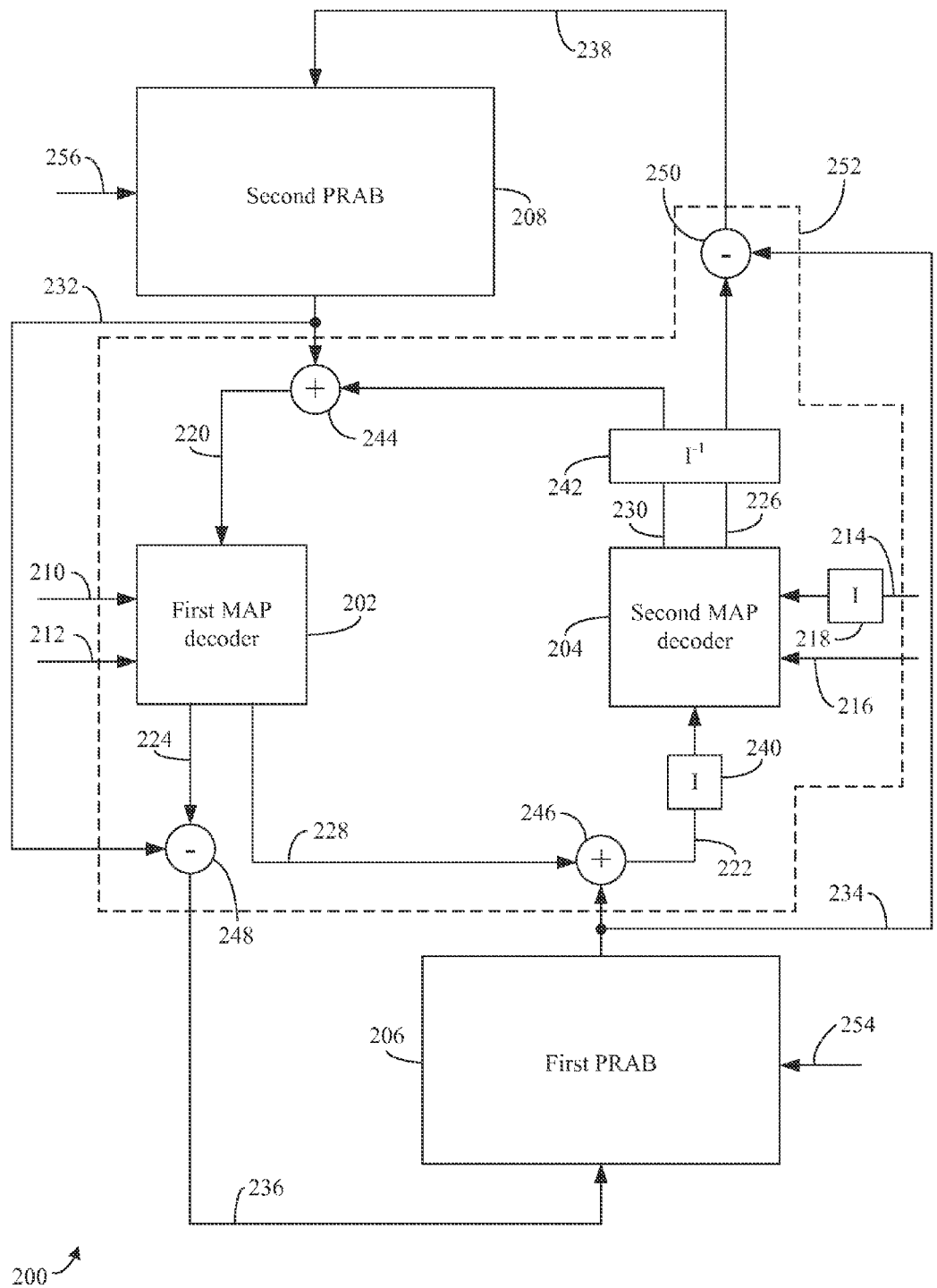
FIG. 2 is a block diagram of a Joint Source Channel Decoder (JSCD) block adapted to perform joint source channel decoding in accordance with an example embodiment described herein.

As noted in the above described LTE architecture 100, a receiver may be configured in ways to perform joint source channel decoding (JSCD). For example, a joint source channel decoding embodiment using the Long Term Evolution (LTE) standard and turbo decoding is described in this section. Referring to FIG. 2, a block diagram of a JSCD block 200 adapted to perform joint source channel decoding is described in accordance with an embodiment herein. JSCD block 200 may be a further embodiment of JSCD block 116 described with respect to FIG. 1 above.

JSCD block 200 is configured to perform iterative decoding of data bits of a data packet received via a source signal to converge on a "soft" decision representation (e.g., a real number value) for each of the data bits that represents the likelihood of a given data bit in the data packet being a logical "1" or a logical "0". These likelihoods may be presented as a ratio of probabilities, as will be discussed in further detail below. In example embodiments, a turbo decoder may include two or more decoders which work cooperatively in order to refine and improve the estimate (i.e., the "soft" decision) of the originally-received data bits over one or more iterations until the "soft" decisions converge on a stable set of values or until the preset maximum number of iterations is reached. Each decoder may be injected with extrinsic information (e.g., determined by the other decoder and/or based on a-priori information (e.g., source statistics) regarding the source signal). Prior solutions perform JSCD with only a single decoder (e.g., a non-interleaved decoder) to avoid improper and/or premature convergence for "soft" decisions. JSCD block 200, as illustrated in FIG. 2, avoids positive feedback of a-priori information regarding the source signal from one decoder to the other by subtracting out extrinsic information based on the a-priori information that is injected into a decoder from the "soft" decision(s) determined by the decoder. As such, JSCD block 200 performs JSCD on both decoders and doubles the improvement achievable versus using only a single decoder.

Each decoder may be based on a MAP (Maximum a-posteriori Probability) algorithm and outputs the "soft" decision information determined using the data bits, corresponding parity bits, and/or extrinsic information. The MAP algorithm employed by the decoders minimizes the probability of bit error by using the entire received sequence of bits to identify the most probable bit value at each state of a trellis that represents the possible stage changes of an encoder (providing the sequence of bits) over time. The MAP algorithm does not constrain the set of bit estimates to necessarily correspond to a valid path through the trellis. As such, the results can differ from those generated by other types of encoders (e.g., Viterbi decoders) that identify the most probable valid path through the trellis. It will be recognized that algorithm(s) in addition to or in lieu of the MAP algorithm may be used by each decoder to perform JSCD.

As will be described below, for a given decoder, the data bits and the corresponding parity bits are included in data packet(s) received via a source signal, and the extrinsic information may be determined and provided by the other decoder and/or analysis logic that determines extrinsic information based on a-priori information regarding the source signal (e.g., source statistics). JSCD block 200 is capable of reducing (e.g., avoiding) positive feedback of extrinsic information based on the source statistics from a particular decoder to the other by subtracting out such extrinsic information from the "soft" decision of the particular decoder during any given iteration.

In accordance with an example embodiment, JSCD block 200 includes a turbo decoder 252 (shown with a dashed outline for illustrative purposes), a first Packet Redundancy Analysis Block (PRAB) 206, and a second PRAB 208. Turbo decoder 252 may be a further embodiment of turbo decoder 162 described with respect to FIG. 1 above. Turbo decoder 252 includes a first MAP decoder 202, a second MAP decoder 204, first interleaver logic 218, second interleaver logic 240, de-interleaver logic 242, first addition logic 244, second addition logic 246, first subtraction logic 248, and second subtraction logic 250. First MAP decoder 202 is configured to iteratively provide "soft" decisions regarding each data bit received by first MAP decoder 202. The "soft" decisions are determined using a MAP algorithm that takes into consideration the received "soft" data bits, received "soft" parity bits that are derived from the data bits, and/or extrinsic information that is determined and provided by second PRAB block, 208 and second MAP decoder 204 during any given iteration.

Second MAP decoder 204 is configured to iteratively provide "soft" decisions regarding each data bit received by second MAP decoder 204. The "soft" decisions are determined using a MAP algorithm that takes into consideration the received "soft" data bits, received "soft" parity bits that are derived from the data bits, and/or extrinsic information that is determined and provided by first PRAB block 206 and first MAP decoder 202 during any given iteration.

First MAP decoder 202 receives "soft" data bits via lines 210 and "soft" parity bits via lines 212. Second MAP decoder 204 receives "soft" data bits via line 214 and "soft" parity bits via line 216. The "soft" parity bits received via lines 212 and 216 may be derived from the "soft" data bits. For example, an encoder which transmits data packets to an LTE receiver that includes JSCD block 200 may employ a turbo coding scheme that generates N parity bits (where N is an integer greater than 1) for every data bit. In one embodiment, the encoder may employ a ⅓ turbo coding scheme. In accordance with this embodiment, two parity bits are generated for each data bit. For each data bit, a pair of convolution encoders included in the encoder generates a corresponding pair of parity bits. One of the parity bits is based on an interleaved version of the data bits, and the other parity bit is based on a non-interleaved version of the data bits. The parity bits that are received by first MAP decoder 202 via line 212 are based on the non-interleaved version of the data bits. First MAP decoder 202 may be referred to as a non-interleaved MAP decoder. The parity bits that are received by second MAP decoder 204 via line 216 are based on the interleaved version of the data bits. Second MAP decoder 204 may be referred to as an interleaved MAP decoder. First interleaver logic 218 receives and interleaves data bits received via line 214 so that the data bits correspond to the parity bits received via line 216.

First MAP decoder 202 also receives extrinsic information determined and provided by second MAP decoder 204 and/or second PRAB 208. Likewise, second MAP decoder 204 receives extrinsic information determined by first MAP decoder 202 and/or first PRAB 206. For example, first MAP decoder 202 receives extrinsic information via line 220, and second MAP decoder 204 receives extrinsic information via line 222. Second PRAB 208 provides extrinsic information via line 232, and first PRAB 206 provides extrinsic information via line 234. First PRAB 206 and second PRAB 208 also receive "soft" bits as inputs (e.g., from first turbo decoder 114 in PHY layer 102 of FIG. 1) via lines 254 and 256, respectively.

Each MAP decoder 202, 204 is configured to provide a "soft" decision value that indicates a likelihood that a given data bit represents a specified binary value, where the specified binary value either a logical "1" or a logical "0," using the received extrinsic information, the received "soft" bit(s), and the received "soft" parity bits. First MAP decoder 202 provides a "soft" decision value via line 224, and second MAP decoder 204 provides a "soft" decision value via line 226. As mentioned earlier, MAP decoders 202, 204 are also configured to provide extrinsic information that is determined by respective MAP decoders 202, 204. First MAP decoder 202 provides extrinsic information via line 228, and second MAP decoder 204 provides extrinsic information via line 230.

During a first iteration, first addition logic 244 adds extrinsic information from second MAP decoder 204 and extrinsic information provided by second PRAB 208 and provides the combined extrinsic information to first MAP decoder 202 via line 220. The extrinsic information provided by second MAP decoder 204 is de-interleaved by de-interleaver logic 242 before being added to the extrinsic information provided by second PRAB 208. It is noted that during the first iteration, the extrinsic information provided by second MAP decoder 204 is "0" because second MAP decoder 204 has yet to perform any operations. Using the "soft" data bits (received via line 210), the received "soft" parity bits (received via line 212), and the combined extrinsic information received via line 220, first MAP decoder 202 provides a "soft" decision (via line 224) and extrinsic information (via line 228) pertaining to one or more data bits of the data packet.

First PRAB 206 receives as an input the "soft" decision provided by first MAP decoder 202. However, any extrinsic information included in the "soft" decision" that is associated with second PRAB 208 is removed (e.g., subtracted out) via first subtraction logic 248 before the "soft" decision" is input into first PRAB 206. That is, the same extrinsic information determined by second PRAB 208 and provided to first MAP decoder 202 is removed from the "soft" decision provided by first MAP decoder 202. The resulting value (i.e., the modified "soft" decision value) is provided to first PRAB 206 via line 236. First PRAB 206 uses the modified "soft" decision value to refine the extrinsic information that first PRAB 206 provides (e.g., via line 234) to second MAP decoder 204 during the next iteration.

Accordingly, during the next iteration, second addition logic 246 adds extrinsic information provided by first PRAB 206 (via line 234) and the extrinsic information provided by first MAP decoder 202 (via line 228) and provides the combined extrinsic information to second MAP decoder 204 via line 222. The combined extrinsic information provided to second MAP decoder 204 is interleaved by second interleaver logic 240 before being provided to second MAP decoder 204. Using the interleaved "soft" data bits (received via line 218), the received "soft" parity bits (received via line 216) that are derived from the interleaved "soft" data bits, and the combined extrinsic information received via line 222, second MAP decoder 204 provides a "soft" decision (via line 226) and extrinsic information (via line 230) pertaining to one or more of the interleaved version of the data bits. The "soft" decision and extrinsic information are then de-interleaved via de-interleaver logic 242.

Second PRAB 208 receives as an input the de-interleaved "soft" decision provided by second MAP decoder 204. However, any extrinsic information included in the "soft" decision" that is associated with first PRAB 206 is removed (e.g., subtracted out) via second subtraction logic 250 before the "soft" decision" is input into second PRAB 208. That is, the same extrinsic information determined by first PRAB 206 and provided to second MAP decoder 204 is removed from the "soft" decision provided by second MAP decoder 204. The resulting value (i.e., the modified "soft" decision value) is provided to second PRAB 208 via line 238. Second PRAB 208 uses the modified "soft" decision value to further refine the extrinsic information that second PRAB 208 provides (e.g., via line 232) to first MAP decoder 202 during the next iteration. The above-described process continues until the "soft" decisions provided by first MAP decoder 202 and second MAP decoder 204 converge on a stable set of values or until the preset maximum number of iterations is reached.

In accordance with some embodiments, to determine whether the "soft" decisions converge on a stable set of values, a CRC operation may be performed. For instance, a check value of the "soft" decision(s) may be determined and compared to a check value received via the data packet. If the two check values are equal to each other, then the CRC operation passes, and a determination is made that the "soft" decisions have converged on a stable set of values. If the two check values are not equal to each other, then the CRC operation fails, and a determination is made that the "soft" decisions have not converged on a stable set of values. It will be recognized that such a CRC operation may be performed on the "soft" decision(s) provided by first MAP decoder 202 and/or the "soft" decisions provided by second MAP decoder 204.

Upon determining that the "soft" decisions converge on a stable set of values, the "soft" decision(s) are converted to "hard" decisions and provided to another component and/or layer of the LTE architecture (e.g., LTE architecture 100 shown in FIG. 1) for further processing. For example, with reference to FIG. 1, the "hard" decisions may be provided to decompression block 152 (e.g., via line 166) of RoHC layer 110.

The MAP algorithm performed by first MAP decoder 202 and second MAP decoder 204 may be configured to provide "soft" decisions as log likelihood ratios (LLRs). For instance, in embodiments where a value $x_k$ represents a data bit for which a "soft" decision is being determined and a value y' represents one or more data bits and parity bits received by a respective MAP decoder, first MAP decoder 202 and second MAP decoder 204 may each be configured to calculate the "soft" decision for $x_k$ according to Equation 1:

$$L_{map}(x_k) = \log\left[\frac{P_r(x_k = 1 \mid y')}{P_r(x_k = 0 \mid y')}\right], \qquad \text{Equation 1}$$

where $P_r(x_k=1|y')$ represents a probability that $x_k$ is equal to a value of "1" given y', and $P_r(x_k=0|y')$ represents a probability that $x_k$ is equal to a value of "0" given y'.

According to Equation 1, each MAP decoder 202, 204 determines a first probability of whether a particular bit (i.e., $x_k$) in a received data packet is a "1" and a second probability of whether the particular bit in the received data packet is "0". First MAP decoder 202 determines the first and second probabilities using the non-interleaved version of the "soft" data bits (received via line 210), the "soft" parity bits based on the non-interleaved version of the "soft" data bits (received via line 212), and the combined extrinsic information that is determined by second MAP decoder 204 and second PRAB 208 (received via line 220). Second MAP decoder 204 determines the first and second probabilities using the interleaved version of the "soft" data bits (received via line 214), the "soft" parity bits based on the interleaved version of the "soft" data bits (received via line 216), and the combined extrinsic information that is determined by first MAP decoder 202 and first PRAB 206 (received via line 222).

After the first and second probabilities are determined, the first probability is divided by the second probability to provide a quotient. Thereafter, the logarithm of the quotient is performed to determine the LLR for the particular bit, which corresponds to the respective MAP decoder's "soft" decision. The LLR represents the likelihood that the particular bit is either a "1" or a "0". For example, if the LLR is a value greater than "0", then it may be inferred that the MAP decoder has estimated that the particular bit is a "1". If the LLR is a value less than "0", then it may be inferred that the MAP decoder has estimated that the particular bit is a "0". The magnitude of the LLR value may represent a confidence level that a MAP decoder has with regard to its "soft" decision. For example, the greater the LLR value, the more confident the MAP decoder is in its "soft" decision. In contrast, the lesser the LLR value, the less confident the MAP decoder is in its "soft" decision.

As described herein, a probability is a decimal number that has a value range of 0.0 (zero) to 1.0 (one). An LLR may be described as a ratio of probabilities, and therefore may be a decimal number that has a theoretical value range from $-\infty$ (negative infinity) to $+\infty$ (positive infinity). LLRs are generally used because the probabilities themselves may approach numbers that are relatively difficult to represent with certainty.

The extrinsic information provided by each MAP decoder is derived from the "soft" decision value determined by the respective MAP decoder. For example, the extrinsic information provided by first MAP decoder 202 (via line 228) may be calculated by subtracting out the extrinsic information that is injected into first MAP decoder 202 (via line 220) and the received "soft" value for the particular bit (including any noise variance) that is to be decoded (received via line 210) from the "soft" decision that is determined by first MAP decoder 202. Similarly, the extrinsic information provided by second MAP decoder 204 (via line 230) may be calculated by subtracting out the extrinsic information that is injected into second MAP decoder 204 (via line 222) and the received "soft" value for the particular bit (including any noise variance) that is to be decoded (received via line 214) from the "soft" decision that is determined by second MAP decoder 204.

The extrinsic information provided by first PRAB 206 is determined by utilizing redundancy in the received source signal and the packet headers of the data packet(s) received via the source signal, along with "soft" decisions received from first MAP decoder 202. The extrinsic information provided by second PRAB 208 is determined by utilizing redundancy in the received source signal and the packet headers of the data packet(s) received via the source signal, along with "soft" decisions received from second MAP decoder 204. As described above, the extrinsic information added to first MAP decoder 202 by the second PRAB 208 is removed from the "soft" decision provided by first MAP decoder 202, and the modified "soft" decision is input to first PRAB 206. Similarly, the extrinsic information added to second MAP decoder 204 by the first PRAB 206 is removed from the "soft" decision provided by second MAP decoder 204, and the modified "soft" decision is input to second PRAB 208.

The LLR (i.e., "soft" decision) generated by first MAP decoder 202 may be represented by $L_{map}^{d1s2}(x_k)$, and the LLR generated by second MAP decoder 204 may be represented by $L_{map}^{d2s1}(x_k)$. The extrinsic information computed by first PRAB 206 may be represented by $L_e^{s2}(x_k)$, and the extrinsic information computed by second PRAB 208 may be represented by $L_e^{s2}(x_k)$. Thus, the LLR information input (i.e., the modified "soft" decision) to first PRAB 206 may be determined according to Equation 2:

$$L_{map}^{d1}(x_k) = L_{map}^{d1s2}(x_k) - L_e^{s2}(x_k), \qquad \text{Equation 2}$$

The LLR information input into second PRAB 208 may be determined according to Equation 3:

$$L_{map}^{d2}(x_k) = L_{map}^{d2s1}(x_k) - L_e^{s1}(x_k), \qquad \text{Equation 3}$$

This LLR information is used by first PRAB 206 and second PRAB 208 along with a-priori information (e.g., redundancy in the received source signal and the packet headers of the data packet(s) that are received via the source signal) to derive prediction probabilities from which predicted LLRs (i.e., the extrinsic information provided by first PRAB 206 and second PRAB 208) are computed.

In embodiments where a value $x_k$ represents a data bit for which a "soft" decision is being determined and a value y' represents one or more data bits and parity bits received by a MAP decoder, first PRAB 206 and second PRAB 208 may each be configured to determine predicted LLRs according to Equation 4:

$$L_e^{si}(x_k) = \log\left[\frac{P_p(x_k = 1 \mid y')}{P_p(x_k = 0 \mid y')}\right] \quad \text{Equation 4}$$

$$i = 1, 2,$$

As mentioned earlier, the predicted probabilities (i.e., $P_p(x_k=1|y')$ and $P_p(x_k=0|y')$) may be based on a-priori information. The a-priori information may be based on redundancy in the received source signal and the packet headers of the data packet(s) received via the source signal. The predicted probabilities may further be based on the "soft" decisions provided by the MAP decoders 202, 204.

For example, first PRAB 206 and second PRAB 208 may use an A-priori Speech Statistics Algorithm (ASSA) that uses a-priori speech information to improve the "soft" decisions provided by first MAP decoder 202 and second MAP decoder 204 and provide extrinsic information accordingly. In particular, the correlation of certain source-encoded speech parameters may be used. For the Adaptive Multi-Rate Narrowband (AMR-NB) speech codec used in Voice over LTE (VoLTE), the parameters that may be focused on include, but not limited to, pitch, Line Spectral Pairs (LSPs), pitch gain, fixed codebook gain, and/or the like. Models (e.g., probability density functions (PDFs)) are obtained for each of the parameters and are applied to update the "soft" decisions that are obtained (e.g., by MAP decoders 202, 204) for each parameter during channel decoding (e.g., turbo decoding in VoLTE). The models that are applied may vary depending upon whether the speech is classified as voiced or unvoiced. For example, in the case of an AMR-NB speech codec operating at 12.2 Kb/s, voiced speech may include up to 23 bits or more of total signal redundancy, and unvoiced speech may include up to 16 bits or more of total signal redundancy. It should also be noted that at lower operating rates, the percentage of total signal redundancy increases, thus offering even greater benefits for parameter correlation. An exemplary ASSA is described in commonly-owned, co-pending U.S. patent application Ser. No. 13/748,904, entitled "Joint Source Channel Decoding Using Parameter Doman Correlation" and filed on even date herewith, the entirety of which is incorporated by reference herein.

Each of first PRAB 206 and second PRAB 208 may also use a Packet Header Statistics Algorithm (PHSA) that uses a-priori information of a protocol stack (e.g., the LTE protocol stack) to improve the "soft" decisions provided by first MAP decoder 202 and second MAP decoder 204 and provide extrinsic information accordingly. Models of each protocol layer are developed which predict the values of the headers in future frames. In particular, models (e.g., probability density functions (PDFs)) are obtained for certain header elements and are applied to update the "soft" decisions that are obtained (e.g., by MAP decoders 202, 204) for each element during channel decoding (e.g., turbo decoding in LTE). Because of the significant redundancy introduced in the headers by the protocol stack, the PHSA used in conjunction with a joint source channel turbo decoder provides significant improvement in channel coding performance.

In embodiments, the PHSA may be utilized with any packet header parameters, such as headers associated with, but not limited to, a MAC layer, an RLC layer, a PDCP layer, and an RoHC layer, as well as an RTP payload, transport block padding, and/or the like. An exemplary PHSA and examples of redundancy in these packet header parameters are described in commonly-owned, co-pending U.S. patent application Ser. No. 13/748,904, entitled "Joint Source Channel Decoding Using Parameter Doman Correlation" and filed on even date herewith, the entirety of which is incorporated by reference herein.

JSCD block 200 and each of the elements included therein may be implemented in hardware, or a combination of hardware and software and/or firmware. Additionally, in some embodiments it is contemplated that first PRAB 204 and second PRAB 206 may coexist in a single PRAB module (not shown), or that a single PRAB may be configured in place of first PRAB 204 and second PRAB 206.

FIG. 3 depicts a flowchart 300 of a method for providing extrinsic information for data bits received in a data packet via a source signal by an interleaved MAP decoder (e.g., second MAP decoder 204) in accordance with an example embodiment described herein. Flowchart 300 may be performed by JSCD block 200 in FIG. 2, for example, and therefore, is described with respect to FIG. 2 for illustrative purposes. Further structural and operational embodiments will be apparent to persons skilled in the relevant art(s) based on the discussion regarding flowchart 300. Flowchart 300 is described as follows.

Flowchart 300 begins with step 302. In step 302, a first extrinsic value provided by a first MAP decoder and a second extrinsic value that is based on a-priori information regarding the source signal are combined to generate a first combined value. The second extrinsic value is provided by analysis logic. For example, as shown in FIG. 2, the first extrinsic value is provided by a non-interleaved MAP decoder such as first MAP decoder 202. The first extrinsic value is the extrinsic information provided via line 228. The second extrinsic value is the extrinsic information provided by first PRAB 206 via line 234. The first extrinsic value and the second extrinsic value are combined using second addition logic 246.

In accordance with an embodiment, the first extrinsic value is combined with the second extrinsic value by adding the second extrinsic value to the first extrinsic value using second addition logic 246.

In step 304, the first combined value is provided to a second MAP decoder. For example, as shown in FIG. 2, the first combined value is provided to second MAP decoder 204 via line 222.

In accordance with an embodiment, the first combined value is provided to second MAP decoder 204 by interleaving the first combined value and providing the interleaved, first combined value to second MAP decoder 204. As shown in FIG. 2, the first combined value is interleaved using second interleaver logic 240.

In step 306, a third extrinsic value is provided by the second MAP decoder. The third extrinsic value is based on at least an interleaved version of data bit(s) of the source signal, first parity bit(s) of the source signal that are derived from the interleaved version of the data bit(s), and the first combined value. For example, as shown in FIG. 2, the third extrinsic value is provided by an interleaved MAP decoder such as second MAP decoder 204. The third extrinsic value is the extrinsic information provided via line 230 and is based on data bit(s) received via line 214 that are interleaved via first interleaver logic 218, parity bit(s) received via line 216, and the first combined value received via 222.

In accordance with an embodiment, the third extrinsic value is provided by second MAP decoder 204 by de-interleaving the third extrinsic value, and providing the de-interleaved, third extrinsic value. As shown in FIG. 2, the third extrinsic value is de-interleaved using de-interleaver logic 242.

FIG. 4 depicts a flowchart 400 of a method for providing extrinsic information for data bits received in a data packet via a source signal by a non-interleaved MAP decoder (e.g., first MAP decoder 202) in accordance with an example embodiment described herein. Flowchart 400 may be performed by JSCD block 200 in FIG. 2, for example, and therefore, is described with respect to FIG. 2 for illustrative purposes. Further structural and operational embodiments will be apparent to persons skilled in the relevant art(s) based on the discussion regarding flowchart 400. Flowchart 400 is described as follows.

Flowchart 400 begins with step 402. In step 402, the third extrinsic value provided by the second MAP decoder and a fourth extrinsic value that is based on a-priori information regarding the source signal are combined to generate a second combined value. The fourth extrinsic value is provided by the analysis logic. For example, as shown in FIG. 2, the third extrinsic value is provided by an interleaved MAP decoder such as second MAP decoder 204. The third extrinsic value is the extrinsic information provided via line 230. The fourth extrinsic value is the extrinsic information provided by second PRAB 208 via line 232. The third extrinsic value and the fourth extrinsic value are combined using first addition logic 244.

In accordance with an embodiment, the third extrinsic value is combined with the fourth extrinsic value by adding the third extrinsic value to the fourth extrinsic value using first addition logic 244.

In step 404, the second combined value is provided to the first MAP decoder. For example, as shown in FIG. 2, the second combined value is provided to first MAP decoder 202 via line 220.

In step 406, the first extrinsic value is provided by the first MAP decoder. The first extrinsic value is based on at least a non-interleaved version of the data bit(s) of the source signal, second parity bit(s) of the source signal that are derived from the non-interleaved version of the data bit(s), and the second combined value. For example, as shown in FIG. 2, the first extrinsic value is provided by a non-interleaved MAP decoder such as first MAP decoder 202. The first extrinsic value is the extrinsic information provided via line 228 and is based on data bit(s) received via line 210, parity bit(s) received via line 212, and the second combined value received via 220.

FIG. 5 depicts a flowchart 500 of a method for providing extrinsic information by the analysis logic based on "soft" decision values provided by an interleaved MAP decoder (e.g., second MAP decoder 204) in accordance with an example embodiment described herein. Flowchart 500 may be performed by JSCD block 200 in FIG. 2, for example, and therefore, is described with respect to FIG. 2 for illustrative purposes. Further structural and operational embodiments will be apparent to persons skilled in the relevant art(s) based on the discussion regarding flowchart 500. Flowchart 500 is described as follows.

Flowchart 500 begins with step 502. In step 502, "soft" decision value(s) are provided by the second MAP decoder. Each of the "soft" decision value(s) indicate a likelihood that the interleaved version of the respective data bit of the data bit(s) represents a respective specified binary value, where the respective specified binary value is a logical one or a logical zero. For example, as shown in FIG. 2, the "soft" decision value(s) are provided by an interleaved MAP decoder such as second MAP decoder 204. The "soft" decision value(s) are provided via line 226.

In step 504, the "soft" decision value(s) provided by the second MAP decoder are modified to generate respective modified soft decision value(s) using the second extrinsic value. For example, as shown in FIG. 2, the "soft" decision value(s) are modified by second subtraction logic 250, and the modified "soft" decision value(s) are provided via line 238.

In accordance with an embodiment, the "soft" decision value(s) provided by the second MAP decoder are modified by subtracting the second extrinsic value provided by the analysis logic from the "soft" decision value(s) provided by the second MAP decoder. For example, as shown in FIG. 2, the second extrinsic value provided by first PRAB 206 via line 234 is subtracted from the "soft" decision value(s) provided by second MAP decoder 204 via line 226 using second subtraction logic 250. The modified "soft" decision value(s) are provided to second PRAB 208 via line 238.

In accordance with another embodiment, the "soft" decision value(s) are de-interleaved, and the "soft" decision value(s) are modified in response to de-interleaving the "soft" decision value(s). For example, as shown in FIG. 2, the "soft" decision value(s) provided via line 226 are de-interleaved using de-interleaver logic 242, and the de-interleaved "soft" decision value(s) are modified via second subtraction logic 250.

In step 506, the fourth extrinsic value is generated by the analysis logic based on at least the a-priori information of the source signal and the respective modified soft decision value(s). For example, as shown in FIG. 2, second PRAB 208 generates the fourth extrinsic value and provides the fourth extrinsic value via line 232.

FIG. 6 depicts a flowchart 600 of a method for providing extrinsic information by the analysis logic based on "soft" decision values provided by a non-interleaved MAP decoder (e.g., first MAP decoder 202) in accordance with an example embodiment described herein. Flowchart 600 may be performed by JSCD block 200 in FIG. 2, for example, and therefore, is described with respect to FIG. 2 for illustrative purposes. Further structural and operational embodiments will be apparent to persons skilled in the relevant art(s) based on the discussion regarding flowchart 600. Flowchart 600 is described as follows.

Flowchart 600 begins with step 602. In step 602, "soft" decision value(s) are provided by the first MAP decoder. Each of the "soft" decision value(s) indicates a likelihood that the non-interleaved version of the respective data bit of the data bit(s) represents a respective specified binary value, where the respective specified binary value is a logical one or a logical zero. For example, as shown in FIG. 2, the "soft" decision value(s) are provided by a non-interleaved MAP decoder such as first MAP decoder 202. The "soft" decision value(s) are provided via line 224.

In step 604, the "soft" decision value(s) provided by the first MAP decoder are modified to generate respective modified soft decision value(s) using the fourth extrinsic value. For example, as shown in FIG. 2, the "soft" decision value(s) are modified by first subtraction logic 248, and the modified "soft" decision value(s) are provided via line 236.

In accordance with an embodiment, the "soft" decision value(s) provided by the first MAP decoder are modified by subtracting the fourth extrinsic value provided by the analysis logic from the "soft" decision value(s) that are provided by the first MAP decoder. For example, as shown in FIG. 2, the fourth extrinsic value provided by second PRAB 208 via line 232 is subtracted from the "soft" decision value(s) provided by first MAP decoder 202 via line 224 using first subtraction logic 248. The modified "soft" decision value(s) are provided to first PRAB 206 via line 236.

In step 606, the second extrinsic value is generated by the analysis logic based on at least the a-priori information of the source signal and the respective modified soft decision value(s). For example, as shown in FIG. 2, first PRAB 206 generates the second extrinsic value and provides the second extrinsic value via line 234.

V. Example Computer System Implementation

The embodiments described herein, including systems, methods/processes, and/or apparatuses, may be implemented using well known computers, such as computer 700 shown in FIG. 7. For example, elements of LTE architecture 100 including turbo decoder 114, AMR 118, demodulator 126, HARQ block 130, reordering and duplication detection block 140, decryption block 144, cipher stream block 148, decompression block 152, jitter buffer 156, JSCD block 116, turbo decoder 162, PRAB(s) 164, and elements thereof; elements of JSCD block 200 including first MAP decoder 202, second MAP decoder 204, first PRAB 206, second PRAB 208, first interleaver logic 218, second interleaver logic 240, de-interleaver logic 242, first addition logic 244, second addition logic 246, first subtraction logic 248, second subtraction logic 250, and elements thereof; each of the steps of flowchart 300 depicted in FIG. 3; each of the steps of flowchart 400 depicted in FIG. 4; each of the steps of flowchart 500 depicted in FIG. 5; and each of the steps of flowchart 600 depicted in FIG. 6 can each be implemented using one or more computers 700.

Computer 700 can be any commercially available and well known computer capable of performing the functions described herein, such as computers available from International Business Machines, Apple, Sun, HP, Dell, Cray, etc. Computer 700 may be any type of computer, including a desktop computer, a laptop computer, etc.

As shown in FIG. 7, computer 700 includes one or more processors (e.g., central processing units (CPUs) or digital signal processors (DSPs)), such as processor 706. Processor 706 may include elements of LTE architecture 100 including turbo decoder 114, AMR 118, demodulator 126, HARQ block 130, reordering and duplication detection block 140, decryption block 144, cipher stream block 148, decompression block 152, jitter buffer 156, JSCD block 116, turbo decoder 162, PRAB(s) 164, and elements thereof of FIG. 1; elements of JSCD block 200 including first MAP decoder 202, second MAP decoder 204, first PRAB 206, second PRAB 208, first interleaver logic 218, second interleaver logic 240, de-interleaver logic 242, first addition logic 244, second addition logic 246, first subtraction logic 248, second subtraction logic 250, and elements thereof of FIG. 2; or any portion or combination thereof, for example, though the scope of the example embodiments is not limited in this respect. Processor 706 is connected to a communication infrastructure 702, which may include, for example, a communication bus. In some embodiments, processor 706 can simultaneously operate multiple computing threads.

Computer 700 also includes a primary or main memory 708, such as a random access memory (RAM). Main memory has stored therein control logic 724 (computer software), and data.

Computer 700 also includes one or more secondary storage devices 710. Secondary storage devices 710 include, for example, a hard disk drive 712 and/or a removable storage device or drive 714, as well as other types of storage devices, such as memory cards and memory sticks. For instance, computer 700 may include an industry standard interface, such as a universal serial bus (USB) interface for interfacing with devices such as a memory stick. Removable storage drive 714 represents a floppy disk drive, a magnetic tape drive, a compact disk drive, an optical storage device, tape backup, etc.

Removable storage drive 714 interacts with a removable storage unit 716. Removable storage unit 716 includes a computer useable or readable storage medium 718 having stored therein computer software 726 (control logic) and/or data. Removable storage unit 716 represents a floppy disk, magnetic tape, compact disc (CD), digital versatile disc (DVD), Blu-ray disc, optical storage disk, memory stick, memory card, or any other computer data storage device. Removable storage drive 714 reads from and/or writes to removable storage unit 716 in a well-known manner.

Computer 700 also includes input/output/display devices 704, such as monitors, keyboards, pointing devices, etc.

Computer 700 further includes a communication or network interface 720. Communication interface 720 enables computer 700 to communicate with remote devices. For example, communication interface 720 allows computer 700 to communicate over communication networks or mediums 722 (representing a form of a computer useable or readable medium), such as local area networks (LANs), wide area networks (WANs), the Internet, etc. Network interface 720 may interface with remote sites or networks via wired or wireless connections. Examples of communication interface 722 include but are not limited to a modem (e.g., for 3G and/or 4G communication(s)), a network interface card (e.g., an Ethernet card for Wi-Fi and/or other protocols), a communication port, a Personal Computer Memory Card International Association (PCMCIA) card, a wired or wireless USB port, etc.

Control logic 728 may be transmitted to and from computer 700 via the communication medium 722.

Any apparatus or manufacture comprising a computer useable or readable medium having control logic (software) stored therein is referred to herein as a computer program product or program storage device. This includes, but is not limited to, computer 700, main memory 708, secondary storage devices 710, and removable storage unit 716. Such computer program products, having control logic stored therein that, when executed by one or more data processing devices, cause such data processing devices to operate as described herein, represent embodiments.

The disclosed technologies may be embodied in software, hardware, and/or firmware implementations other than those described herein. Any software, hardware, and firmware implementations suitable for performing the functions described herein can be used.

VI. Conclusion

While various embodiments have been described above, it should be understood that they have been presented by way of example only, and not limitation. It will be apparent to persons skilled in the relevant art(s) that various changes in form and details can be made therein without departing from the spirit and scope of the disclosed technologies as defined in the appended claims. Thus, the breadth and scope of the disclosed technologies should not be limited by any of the above-described exemplary embodiments, but should be defined only in accordance with the following claims and their equivalents.

What is claimed is:

1. A method for iteratively decoding a source signal in a system including a first Maximum A-posteriori Probability (MAP) decoder, a second MAP decoder, and analysis logic, the method comprising:

combining a first extrinsic value provided by the first MAP decoder and a second extrinsic value that is based on a-priori information regarding the source signal to generate a first combined value, the second extrinsic value being provided by the analysis logic;

providing the first combined value to the second MAP decoder; and providing a third extrinsic value by the second MAP decoder that is based on at least an interleaved version of one or more data bits of the source signal, one or more first parity bits of the source signal that are derived from the interleaved version of the one or more data bits, and the first combined value.

2. The method of claim 1, further comprising:

combining the third extrinsic value provided by the second MAP decoder and a fourth extrinsic value that is based on a-priori information regarding the source signal to generate a second combined value, the fourth extrinsic value being provided by the analysis logic;

providing the second combined value to the first MAP decoder; and providing the first extrinsic value by the first MAP decoder, the first extrinsic value being based on at least a non-interleaved version of the one or more data bits of the source signal, one or more second parity bits of the source signal that are derived from the non-interleaved version of the one or more data bits, and the second combined value.

3. The method of claim 2, wherein combining the third extrinsic value provided by the second MAP decoder and the fourth extrinsic value that is based on a-priori information of the source signal comprises:

adding the fourth extrinsic value provided by the analysis block to the third extrinsic value provided by the second MAP decoder.

4. The method of claim 2, further comprising:

providing one or more soft decision values by the second MAP decoder, each of the one or more soft decision values indicating a likelihood that the interleaved version of the respective data bit of the one or more data bits represents a respective specified binary value, the respective specified binary value being a logical one or a logical zero;

modifying the one or more soft decision values provided by the second MAP decoder to generate one or more respective modified soft decision values using the second extrinsic value; and generating the fourth extrinsic value by the analysis logic based on at least the a-priori information of the source signal and the one or more respective modified soft decision values.

5. The method of claim 4, further comprising:

de-interleaving the one or more soft decision values, wherein modifying the one or more soft decision values comprises:

modifying the one or more soft decision values in response to de-interleaving the one or more soft decision values.

6. The method of claim 4, wherein modifying the one or more soft decision values provided by the second MAP decoder comprises:

subtracting the second extrinsic value provided by the analysis logic from a respective soft decision value of the one or more soft decision values provided by the second MAP decoder.

7. The method of claim 2, further comprising:

providing one or more soft decision values by the first MAP decoder, each of the one or more soft decision values indicating a likelihood that the non-interleaved version of the respective data bit of the one or more data bits represents a respective specified binary value, the respective specified binary value being a logical one or a logical zero;

modifying the one or more soft decision values provided by the first MAP decoder to generate one or more respective modified soft decision values using the fourth extrinsic value; and generating the second extrinsic value by the analysis logic based on at least the a-priori information of the source signal and the one or more respective modified soft decision values.

8. The method of claim 7, wherein modifying the one or more soft decision values provided by the first MAP decoder comprises:

subtracting the fourth extrinsic value provided by the analysis logic from a respective soft decision value of the one or more soft decision values provided by the first MAP decoder.

9. The method of claim 1, wherein providing the first combined value to the second MAP decoder comprises:

interleaving the first combined value; and providing the interleaved, first combined value to the second MAP decoder; and wherein providing the third extrinsic value by the second MAP decoder comprises:

de-interleaving the third extrinsic value; and providing the de-interleaved, third extrinsic value.

10. The method of claim 1, wherein combining the first extrinsic value provided by the first MAP decoder and the second extrinsic value that is based on a-priori information regarding the source signal comprises:

adding the second extrinsic value provided by the analysis block to the first extrinsic value provided by the first MAP decoder.

11. A turbo decoder, comprising:

a first MAP decoder;

a second MAP decoder coupled to the first MAP decoder;

analysis logic coupled to the first MAP decoder and the second MAP decoder; and first addition logic configured to:

combine a first extrinsic value provided by the first MAP decoder and a second extrinsic value that is based on a-priori information regarding a source signal received by the turbo decoder to generate a first combined value, the analysis logic being configured to provide the second extrinsic value; and provide the first combined value to the second MAP decoder, the second MAP decoder being configured to provide a third extrinsic value that is based on at least an interleaved version of one or more data bits of the source signal, one or more first parity bits of the source signal that are derived from the interleaved version of the one or more data bits, and the first combined value.

12. The turbo decoder of claim 11, further comprising:

second addition logic configured to:

combine the third extrinsic value provided by the second MAP decoder and a fourth extrinsic value that is based on a-priori information regarding the source signal to generate a second combined value, the fourth extrinsic value being provided by the analysis logic; and provide the second combined value to the first MAP decoder; and wherein the first MAP decoder is configured to provide the first extrinsic value, the first extrinsic value being based on at least a non-interleaved version of the one or more data bits of the source signal, one or more second parity bits of the source signal that are derived from the non-interleaved version of the one or more data bits, and the second combined value.

13. The turbo decoder of claim 12, wherein the second addition logic is configured to add the fourth extrinsic value provided by the analysis block to the third extrinsic value provided by the second MAP decoder to generate the second combined value.

14. The turbo decoder of claim 12, wherein the second MAP decoder is configured to provide one or more soft decision values, each of the one or more soft decision values indicating a likelihood that the interleaved version of the respective data bit of the one or more data bits represents a respective specified binary value, the respective specified binary value being a logical one or a logical zero;

wherein the turbo decoder further comprises:
subtraction logic configured to modify the one or more soft decision values provided by the second MAP decoder to generate one or more respective modified soft decision values using the second extrinsic value; and wherein the analysis logic is configured to generate the fourth extrinsic value based on at least the a-priori information of the source signal and the one or more respective modified soft decision values.

15. The turbo decoder of claim 14, further comprising:
de-interleaver logic configured to de-interleave the one or more soft decision values;

wherein the subtraction logic is configured to modify the one or more soft decision values in response to the one or more soft decision values being de-interleaved.

16. The turbo decoder of claim 14, wherein the subtraction logic is configured to subtract the second extrinsic value provided by the analysis logic from a respective soft decision value of the one or more soft decision values provided by the second MAP decoder to generate the one or more respective modified soft decision values.

17. The turbo decoder of claim 12, wherein the first MAP decoder is configured to provide one or more soft decision values, each of the one or more soft decision values indicating a likelihood that the non-interleaved version of the respective data bit of the one or more data bits represents a respective specified binary value, the respective specified binary value being a logical one or a logical zero;

wherein the turbo decoder further comprises:
subtraction logic configured to modify the one or more soft decision values provided by the first MAP decoder to generate one or more respective modified soft decision values using the fourth extrinsic value; and wherein the analysis logic is configured to generate the second extrinsic value based on at least the a-priori information of the source signal and the one or more respective modified soft decision values.

18. The turbo decoder of claim 17, wherein the subtraction logic is configured to subtract the fourth extrinsic value provided by the analysis logic from a respective soft decision value of the one or more soft decision values provided by the first MAP decoder to generate the one or more respective modified soft decision values.

19. The turbo decoder of claim 11, wherein the first addition logic is configured to add the second extrinsic value provided by the analysis block to the first extrinsic value provided by the first MAP decoder to generate the first combined value.

20. A non-transitory computer readable storage medium having computer program instructions embodied in said computer readable storage medium for enabling a processor to iteratively decode a source signal in a system including a first Maximum A-posteriori Probability (MAP) decoder, a second MAP decoder, and analysis logic, the computer program instructions including instructions executable to perform operations comprising:

causing a first extrinsic value provided by the first MAP decoder and a second extrinsic value that is based on a-priori information regarding the source signal to be combined to generate a first combined value, the second extrinsic value being provided by the analysis logic; and causing the second MAP decoder to provide a third extrinsic value that is based on at least an interleaved version of one or more data bits of the source signal, one or more first parity bits of the source signal that are derived from the interleaved version of the one or more data bits, and the first combined value.

* * * * *